(12) United States Patent
Lin et al.

(10) Patent No.: US 9,209,273 B1
(45) Date of Patent: Dec. 8, 2015

(54) METHOD OF FABRICATING METAL GATE STRUCTURE

(71) Applicant: UNITED MICROELECTRONICS CORP., Hsin-Chu (TW)

(72) Inventors: Ching-Ling Lin, Kaohsiung (TW); Chih-Sen Huang, Tainan (TW); Shih-Fang Tzou, Tainan (TW); Chien-Ting Lin, Hsinchu (TW); Yi-Wei Chen, Taichung (TW); Shi-Xiong Lin, Yilan County (TW); Chun-Lung Chen, Tainan (TW); Kun-Yuan Liao, Hsin-Chu (TW); Feng-Yi Chang, Tainan (TW); Hsiao-Pang Chou, New Taipei (TW); Chia-Lin Lu, Taoyuan County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/463,677

(22) Filed: Aug. 20, 2014

(30) Foreign Application Priority Data

Jul. 23, 2014 (CN) .......................... 2014 1 0351939

(51) Int. Cl.
H01L 21/4763 (2006.01)
H01L 29/66 (2006.01)
H01L 27/088 (2006.01)
H01L 29/51 (2006.01)
H01L 29/49 (2006.01)
H01L 21/3213 (2006.01)
H01L 21/8234 (2006.01)
H01L 21/8238 (2006.01)

(52) U.S. Cl.
CPC .... *H01L 29/66545* (2013.01); *H01L 21/32133* (2013.01); *H01L 21/32139* (2013.01); *H01L 21/82385* (2013.01); *H01L 21/823456* (2013.01); *H01L 27/088* (2013.01); *H01L 29/4966* (2013.01); *H01L 29/517* (2013.01)

(58) Field of Classification Search
CPC .................... H01L 29/66734; H01L 21/82385
See application file for complete search history.

(56) References Cited

U.S. PATENT DOCUMENTS

| | | | |
|---|---|---|---|
| 8,084,311 B1 | 12/2011 | Horak | |
| 8,436,404 B2 | 5/2013 | Bohr | |
| 8,481,415 B2 | 7/2013 | Yuan | |
| 2001/0055842 A1* | 12/2001 | Uh et al. | 438/183 |
| 2009/0065779 A1* | 3/2009 | Kusumoto | 257/66 |
| 2009/0087974 A1* | 4/2009 | Waite et al. | 438/592 |
| 2012/0313178 A1* | 12/2012 | Liao et al. | 257/368 |
| 2013/0052339 A1 | 2/2013 | Shih | |
| 2014/0008720 A1* | 1/2014 | Xie et al. | 257/331 |
| 2014/0070320 A1* | 3/2014 | Mukherjee et al. | 257/368 |

* cited by examiner

*Primary Examiner* — Angel Roman
(74) *Attorney, Agent, or Firm* — Winston Hsu; Scott Margo

(57) ABSTRACT

A method for fabricating a metal gate structure includes providing a substrate on which a dielectric layer, a first trench disposed in the dielectric layer, a first metal layer filling up the first trench, a second trench disposed in the dielectric layer, a second metal layer filling up the second trench are disposed, and the width of the first trench is less than the width of the second trench; forming a mask layer to completely cover the second trench; performing a first etching process to remove portions of the first metal layer when the second trench is covered by the mask layer; and performing a second etching process to concurrently remove portions of the first metal layer and portions of the second metal layer after the first etching process.

20 Claims, 6 Drawing Sheets

METHOD OF FABRICATING METAL GATE STRUCTURE

BACKGROUND OF THE INVENTION

1. Field of the Invention

The present invention relates generally to a method for fabricating a metal gate structure, and more particularly to a method applied in metal gate structures having gate trenches with different widths.

2. Description of the Prior Art

With the trend of miniaturization in the semiconductor industry with corresponding improvements in semiconductor manufacturing processes, manufactures are able to form both dense regions and sparse regions on one chip.

During an etching process of fabricating patterned structures, however, etching rates in the dense regions are often different from those in the sparse regions due to density difference. In general, the etching rate in the dense region is lower than that in the sparse regions. Hence, for trenches respectively formed in the dense regions and the sparse regions, their depths often deviate from their predetermined values after the above-mentioned etching process. For example, the trenches in the sparse regions are usually deeper than those in the dense regions, which may cause a pre-layer to be exposed from the bottom of the trenches and negatively affect the electrical propertied of the corresponding semiconductor devices.

SUMMARY OF THE INVENTION

A metal gate structure and a method for fabricating the same are therefore disclosed according to embodiments of the present invention.

A method for fabricating a metal gate structure is disclosed according to one embodiment of the present invention. The method includes the following steps: providing a substrate which a dielectric layer, a first trench disposed in the dielectric layer, a first metal layer filling up the first trench, a second trench disposed in the dielectric layer, a second metal layer filling up the second trench are disposed on the substrate, and the width of the first trench is less than the width of the second trench; forming a mask layer to completely cover the second trench; performing a first etching process to remove portions of the first metal layer when the second trench is covered by the mask layer; and performing a second etching process to concurrently remove portions of the first metal layer and portions of the second metal layer after the first etching process.

A metal gate structure is also disclosed according to another embodiment of the present invention. The metal gate structure includes at least a substrate, a dielectric layer, first and second trenches, first metal layer and second metal layers, and two cap layers. In particular, the dielectric layer is disposed on the substrate, and the first and second trenches are disposed in the dielectric layer. The width of the first trench is less than the width of the second trench. The first and second metal layers are respectively disposed in the first trench and the second trench, and the height of the first metal layer is less than or equal to the height of the second metal layer. The cap layers are respectively disposed in a top surface of the first metal layer and a top surface of the second metal layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
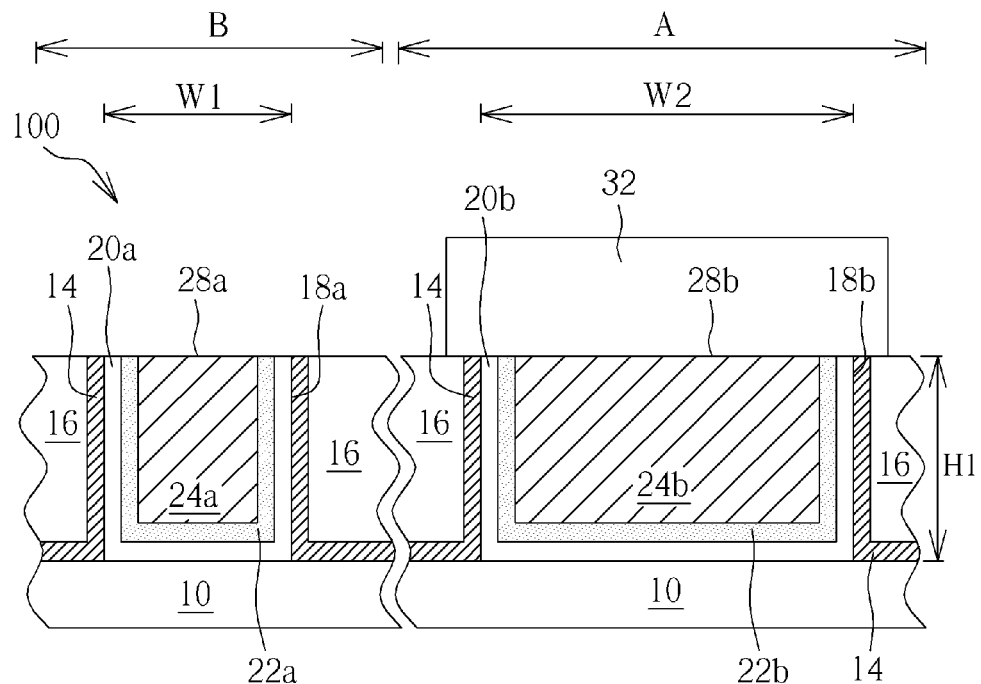
FIG. 1 to FIG. 11 are cross-sectional diagrams showing a method for fabricating a semiconductor device according to embodiments of the present invention.

In the following description, numerous specific details are given to provide a thorough understanding of the invention. It will, however, be apparent to one of ordinary skill in the art that the invention may be practiced without these specific details. Furthermore, some well-known system configurations and process steps are not disclosed in detail.

The drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

FIG. 1 to FIG. 11 are cross-sectional diagrams showing a method for fabricating a metal gate structure according to embodiments of the present invention. FIG. 1 is a cross-sectional diagram showing a semi-finished semiconductor device at the beginning of the process according to one embodiment of the invention. As shown in FIG. 1, the semi-finished semiconductor device 100 includes at least a substrate 10, a dielectric layer 16 disposed on the substrate 10, first and second trenches 18a and 18b disposed in the dielectric layer 16, a first metal layer 24 disposed in first trench 18a, and a second metal layer 24b disposed in second trench 18b. Also, the substrate 10 may be divided to two regions: a first region A and a second region B, which may respectively correspond to a sparse region and a dense region. In the following processes, the sparse region may have a low device density while the dense region may have a higher device density. The substrate 10 disclosed above may be a silicon substrate, a germanium substrate, a germanium arsenide substrate, a germanium silicon substrate, a silicon-on-insulator substrate or other suitable substrate. Additionally, the substrate 10 may have fin-structures or planar structures.

The first trench 18a and the second trench 18b are respectively disposed within the first region A and the second region B. The width W1 of the first trench 18a may be less than the width W2 of the second trench 18b and is preferably less than one-third of the width W2 of the second trench 18b. It should be noted that the term "trench width" disclosed throughout the following paragraphs should be interpreted as a lateral length of the trench which is parallel to the corresponding channel length. Also, it may be interpreted as a short side of a loop-shaped gate spacer or a short side of an enclosed region defined by an etch stop layer 14.

The first metal layer 24a and the second metal layer 24b respectively fill up the first trench 18a and the second trench 18b, and their top surfaces 28a and 28b of the first metal layer 24a and the second metal layer 24b are respectively aligned with a top surface of the dielectric layer 16. Hence, their heights are all at a first predetermined height H1. Additional gate dielectric layers 20a and 20b, such as high k-dielectric layers, and additional gate material layers 22a and 22b, such as work function metal layers, may be respectively interposed between the first and second metal layers 24a and 24b and the substrate 10. Preferably, the gate dielectric layer 20a and 20b, the gate material layer 22a and 22b, and the metal layer 24a and 24b are sequentially disposed in respective trench 18a and 18b. Moreover, additional barrier layer and/or adhesion layer may be interposed between the gate dielectric layer and the gate material layer and/or between the gate material layer and the metal layer, which may be used to prevent the diffusion of atoms in two adjacent layers or increase the adhesivity of two adjacent layers.

The above-mentioned semi-finished semiconductor device 100 is fabricated through a replacement metal gate (RMG) process together with a high-k last process, which causes the first and second gate dielectric layers 20a and 20b and the first and second gate material layers 22a and 22b to have U-shaped cross-section. The semi-finished semiconductor device 100, however, may also be fabricated through a replacement metal gate (RMG) process together with a high-k first process. In this way, the gate dielectric layers may have I-shaped cross-section rather than U-shaped cross-section.

The first gate dielectric layer 20a and the second gate dielectric layer 20b may be composed of metal oxides with dielectric constant substantially greater than 20. As an example, the dielectric layers may be selected from the group consisting of hafnium oxide ($HfO_2$), hafnium silicon oxide ($HfSiO_4$), hafnium silicon oxynitride (HfSiON), aluminum oxide ($Al2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT), lead zirconate titanate ($PbZrxTi_1-xO_3$, PZT), and barium strontium titanate ($BaxSr_1-xTiO_3$, BST), but is not limited thereto. The gate electrode 143 may include metal or metal oxide with superior filling ability and relatively low resistance, such as aluminum (Al), titanium aluminum (TiAl), titanium aluminum oxide (TiAlO), tungsten (W) or copper (Cu), but is not limited thereto. The first gate material layer 22a and the second gate material layer 22b are used as function layer, and the compositions of which are dependent on the types of the corresponding transistors. For example, the function layer may be a titanium nitride layer when the corresponding transistor is P-type, while the function layer may be an aluminum nitride layer when the corresponding transistor is N-type. The barrier layer may be a titanium nitride layer, a tantanum nitride layer or a composite layer including a titanium nitride layer and a tantanum nitride layer, but is not limited thereto. Additionally, the first metal layer 24a and the second metal layer 24b may be chosen from metals or alloys with low resistance, such as aluminum, tungsten and the like.

A mask layer 32 is then formed to completely cover the second trench 18b. The mask layer 32 may be a patterned photoresist obtained through regular photolithographic process or a patterned dielectric layer obtained through a regular photolithographic process, a deposition process and an etching process, but is not limited thereto. Specifically, the second gate dielectric layer 20b, the second gate material layer 22b and the second metal layer 24b inside the second trench 18b may all be completely covered by the mask layer 32, while the first gate dielectric layer 20a, the first gate material layer 22a and the first metal layer 24a inside the first trench 18a are all exposed from the mask layer 32.

Figure 2:
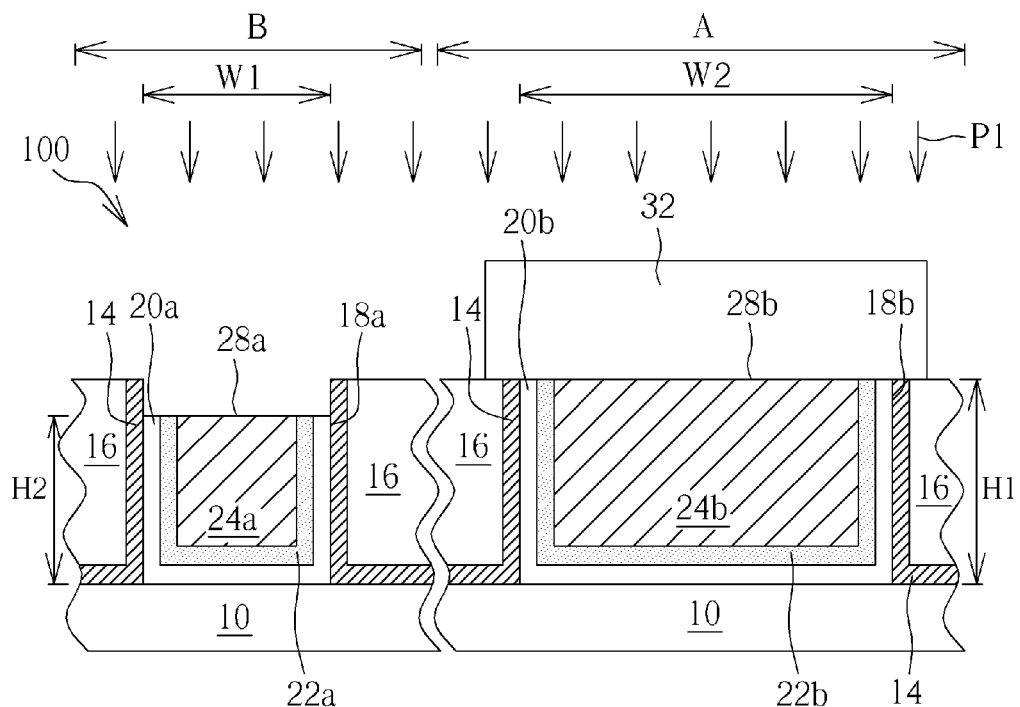

FIG. 2 is a cross-sectional diagram showing a semi-finished semiconductor device after the first etching process. After the step of forming the mask layer 32, at least a first etching process P1 is carried out to remove portions of the first gate dielectric layer 20a, portions of the first gate material layer 22a and portions of first metal layer 24a in the first trench 18a until the top surfaces of first gate dielectric layer 20a, the first gate material layer 22a and the first metal layer 24a reduce to a second predetermined height H2. During the first etching process P1, portions of the mask layer 32 may be removed concurrently. In addition, according to various recipes, the top surfaces of the first gate dielectric layer 20a, the first gate material layer 22a and the first metal layer 24 are not restricted to be at the equal height. For instance, the top surfaces of the first gate dielectric layer 20a and the first gate material layer 22a may be slightly lower than the top surface of the first metal layer 24a, which means their heights are slightly lower than the second predetermined height H2.

The above-mentioned first etching process P1 may be a dry etching process, which uses, for example, a mixture of $Cl_2$/$BCl_3$/$O_2$ as etchants, but is not limited thereto. Additionally, the first etching process P1 may also be a wet etching process. Moreover, the first etching process P1 may include a plurality of sub-etching processes.

Figure 3:
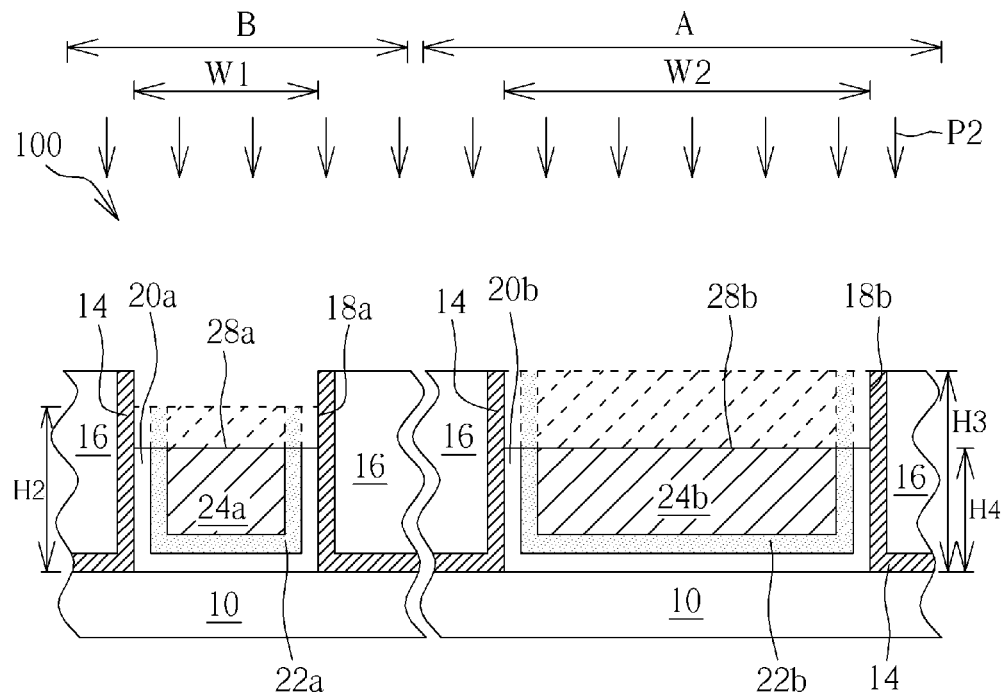

A second etching process is then carried out after the removal of the mask layer 32, and the height of each layer in the first and second trenches may be concurrently lowered during the second etching process. As shown in FIG. 3, FIG. 3 is a cross-sectional diagram showing a structure after the second etching process. Because the width W1 of the first trench 18a is less than the W2 of the second trench 18b, during the second etching process P2, etchants received by per unit area of the first trench 18a are less than those received by per unit area of the second trench 18b. As a result, the etching rates to each layer in the first trench 18 are slower than those to each layer in the second trench 18b.

Through the preceding processes: forming the mask layer 32, performing the first etching process P1 only to the first trench 18a, removing the mask layer 32, and performing the second etching process P2 to layers in the first trench 18a and the second trench 18b, the height of the top surface of each layer in the second trench 18b may be kept in a certain range not lower than the predetermined height. Hence, the substrate 10 underneath the bottom of the second trench 18b may not be exposed during the etching processes. In this way, the micro loading effect may be prevented, and the yield rate of the process is increased. Additionally, the height of the top surface of each layer in the first trench 18a may be substantially equal to or slightly lower than that of the top surface of each layer in the second trench 18b. Therefore, the uniformity of the metal gate electrodes in different regions may be increased.

Figure 4:
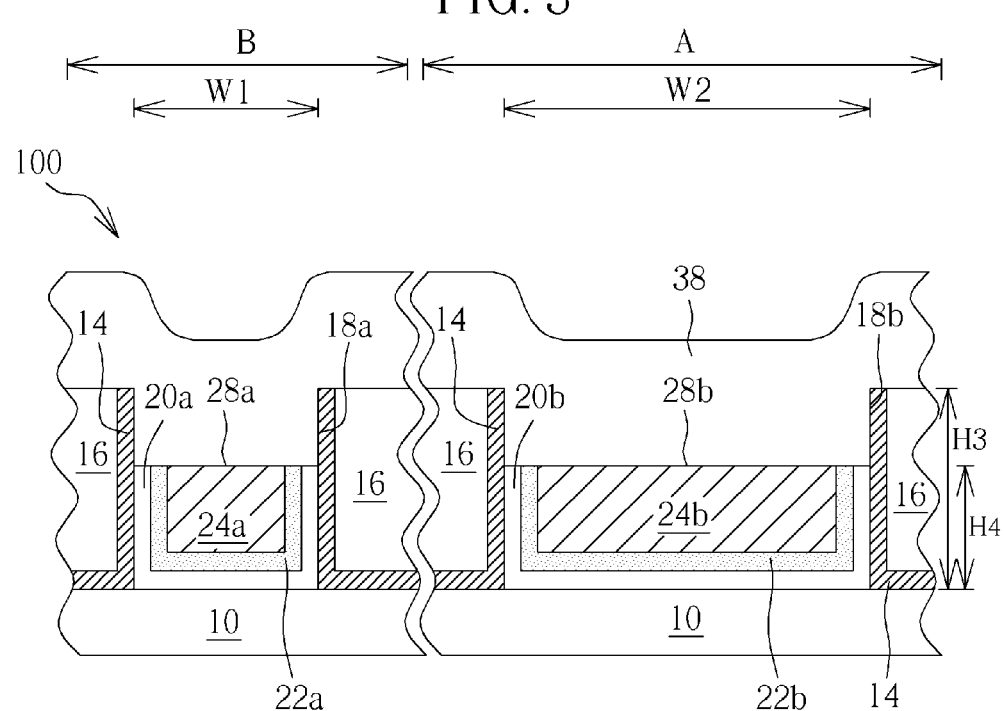

FIG. 4 is a schematic diagram showing a semi-finished semiconductor device after the step of depositing a cap layer according to an embodiment of the present invention. Subsequently to the second etching process P2, a single-layered or multi-layered cap layer 38 is blankly deposited to fill up the first trench 18a and the second trench 18b and cover the dielectric layer 16. Preferably, the cap layer 38 has a rough surface and is thick enough so that it can fill up the first trench 18a and the second trench 18b.

Figure 5:
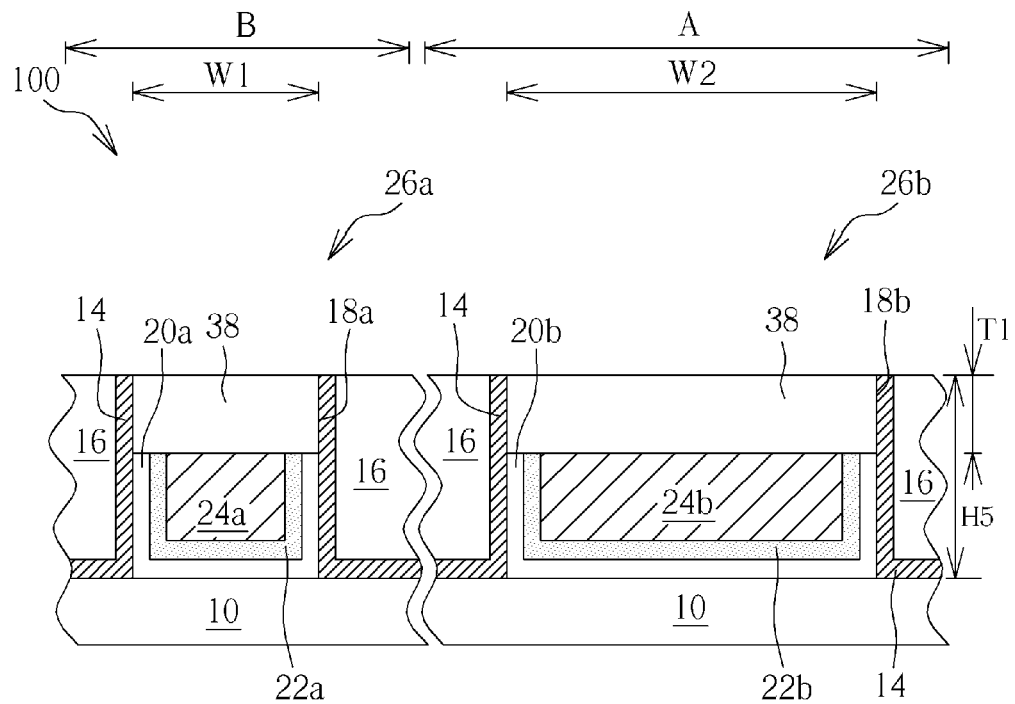
Figure 6:
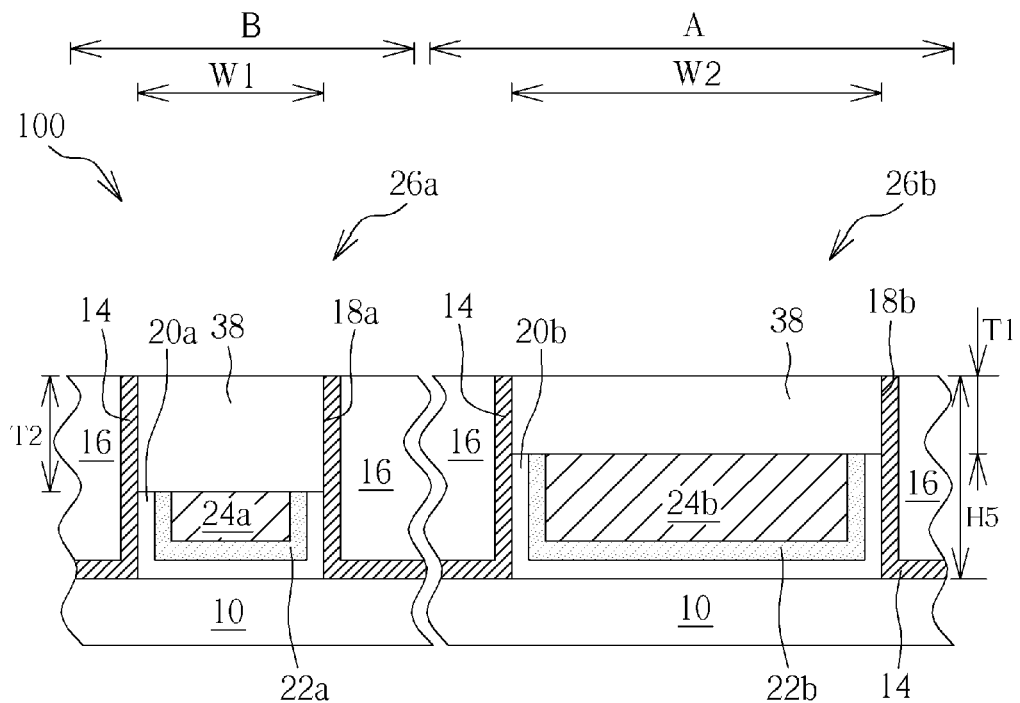

A chemical mechanical polishing (CMP) process or an etching process together with a CMP process is then carried out to planarize the cap layer 38 until the top surface of the cap layer 38 is aligned with the top surface of the dielectric layer 16. FIG. 5 is a cross-sectional diagram showing a semi-finished semiconductor device after the step of planarizing the cap layer. As shown in FIG. 5, the planarized cap layer 38 may have a predetermined width T1. In addition, in order to let the cap layer 38 within the first region A and the second region B have a flat surface, part of the dielectric layer 16 may also be removed during the planarization process, which reduces its height from the third predetermined height H3 to a fifth predetermined height H5. A metal gate structure according to the first embodiment of the present invention is therefore obtained. In particular, the first metal structure 26a and the second metal structure 26b may be respectively disposed within the first region A and the second region B. The top surface 28a of the first metal layer 24a may be aligned with or slightly lower than the top surface 28b of the second metal layer 24b.

In the following processes for forming a self-aligned contact structure, the cap layer 38 may be used to protect the underneath metal layer 24a and 24b, the gate material layer 22a and 22b and the gate dielectric layer 20a and 20b from unnecessary electrical connection.

In addition to the above-mentioned method for fabricating the metal gate structure, the method may also be modified according to other embodiments derived from the first embodiment. These embodiments are disclosed in the following paragraphs. Structures and methods disclosed in the following embodiments are analogous to those disclosed in the first embodiment, and the similar parts are omitted for the sake of brevity.

Figure 7:
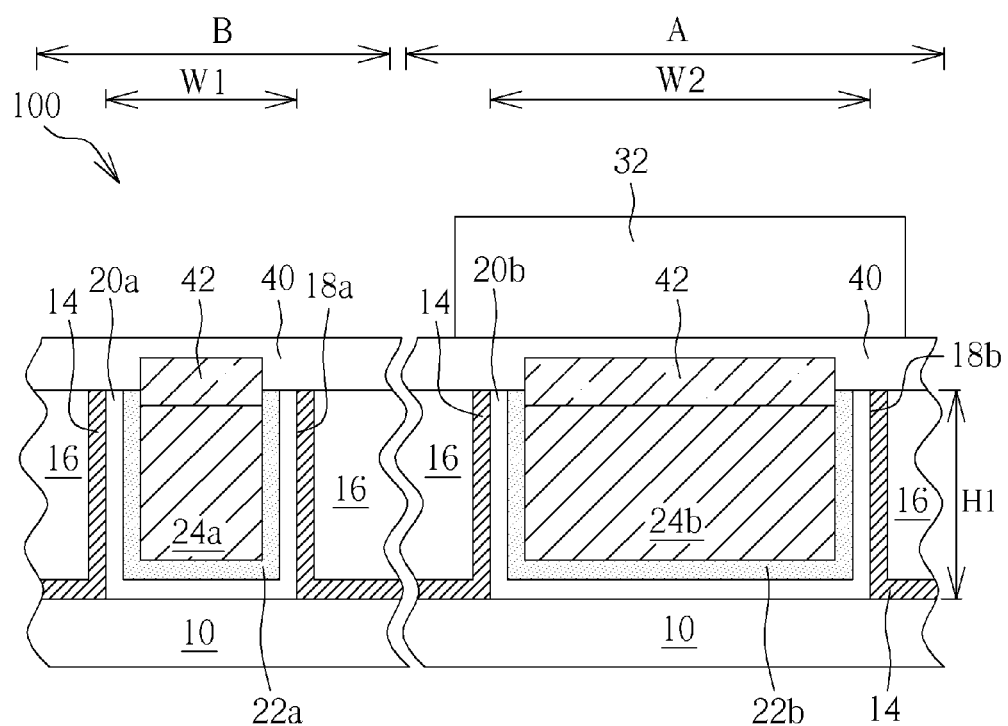
Figure 8:
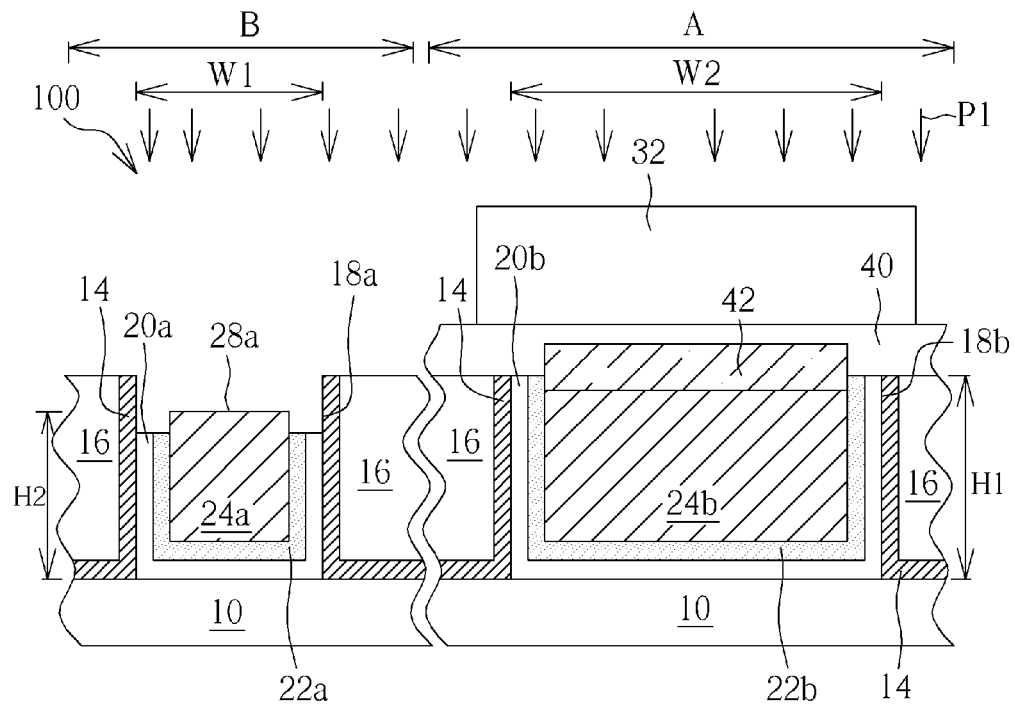
Figure 9:
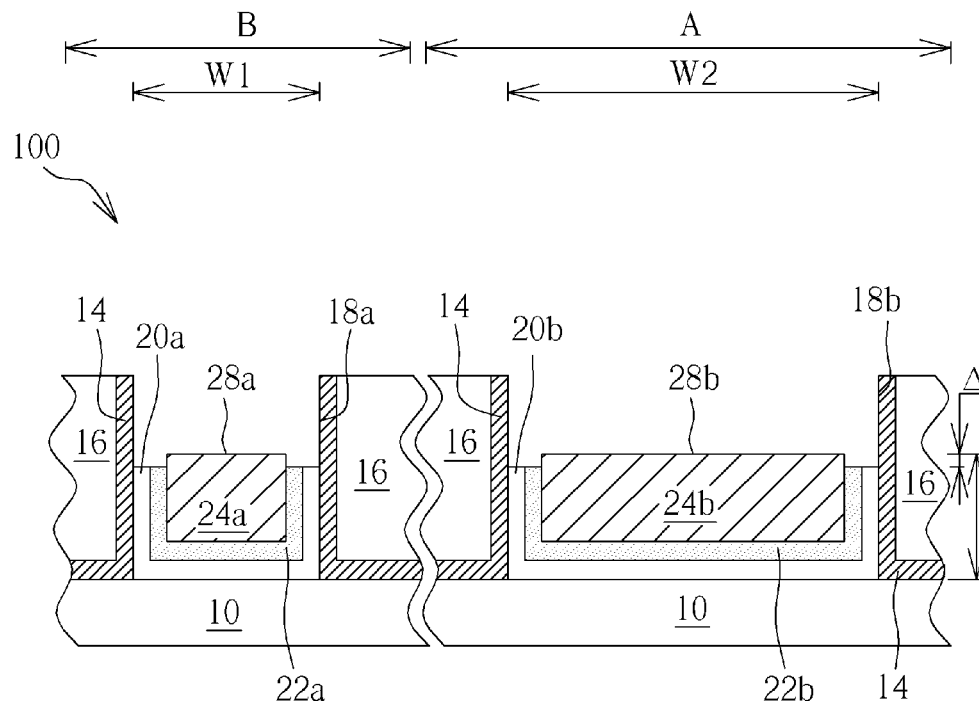

FIG. 7 to FIG. 9 is a method for fabricating a metal gate structure according to one embodiment of the present invention. One main difference between the present embodiment and the first embodiment is that additional dielectric films 40 are respectively interposed between the mask layer 32 and the first trench 18a and between the mask layer 32 and the second trench 18b. The mask layer 32 is used to prevent the layers in the first trench 18a and the second trench 18b from been removed or contaminated during the formation of the mask layer 32.

As shown in FIG. 7, the semi-finished semiconductor device 100 is held by a platform and is applied with an electrostatic field with specific intensity. The first metal layer 24a may react with the second metal layer 24b under this electrostatic field. As a result, a metal compound 42 with high resistance may be formed at the interface between the dielectric film 40 and the first metal layer 24a and between the dielectric film 40 and the second metal layer 24b. The metal compound 42 may be made of metal oxide or metal nitride, but not limited thereto. Because the metal compound 42 is produced from the reaction between the dielectric film 40 and the first metal layer 24a and between the dielectric film 40 and the second metal layer 24b, the metal components of the metal compound 42 must be chosen from at least one of the metal components of the first metal layer 24a or the second metal layer 24b. For example, when the composition of the dielectric film 40 is oxide, and the compositions of the first and second metal layers 24a and 24b are tungsten, the composition of the metal compound 42 may at least includes tungsten oxide. Analogically, in other circumstances, the metal compound 42 may be composed of tungsten nitride, aluminum oxide or aluminum nitride, bur is not limited thereto.

FIG. 8 is a cross-sectional diagram showing a semi-finished semiconductor device after the first etching process according to one embodiment of the present invention. Similarly, the first etching process P1 applied in the first embodiment may then be applied after the formation of the metal compound 42. Portions of the first gate dielectric layer 20a, portions of the first gate material layer 22a, and portions of the first metal layer 24a may be removed during the first etching process P1. When the first etching process P1 is completed, the top surface of the first metal layer 24a may be reduced to a second predetermined height H2. Also, due to the relatively low etching rates of the metal compound 42, the top surfaces of the first gate dielectric layer 20a and the first gate material layer 22a may be slightly lower than the top surface of the first metal layer 24a.

Subsequently, the mask layer 32 is removed. A second etching process is then carried out to further reduce the heights of each layer in the first and second trenches 18a and 18b and completely remove the metal compound 42 in the first and second trenches 18a and 18b. The corresponding structure is shown in FIG. 9. Because the metal compound 42 in the first trench and the second trench has high resistance, it is preferably completely removed through the second etching process P2 so as to increase the electrical properties of the device.

Similarly, due to the relatively low etching rates of the metal compound 42, the top surfaces of the second gate dielectric layer 20b and the second gate material layer 22b are slightly lower than the top surface of the second metal layer 24b once the second etching process P2 is completed. Hence, there is a height difference AH between them.

Subsequently, similar to the steps shown in FIG. 4 and FIG. 5, a single-layered or multi-layered cap layer 38 is blankly deposited to fill up the first trench 18a and the second trench 18b and cover the dielectric layer 16. Preferably, the cap layer 38 has a rough surface and is thick enough so that it can fill up the first trench 18a and the second trench 18b. Afterward, a CMP process is carried out to planarize the cap layer 38 until the top surface of the cap layer 38 is aligned with the top surface of the dielectric layer 16. The planarized cap layer 38 may have a predetermined width T1, and part of the dielectric layer 16 may also be removed during the planarization process.

According to the preceding embodiments, the metal gate structure 26a and 26b include at least the gate dielectric layer 20a and 20b, the gate material layer 22a and 22b, the metal layer 24a and 24b and the cap layer 38. The cap layer 38 has a predetermined width T1 and is used to protect the underneath metal layer 24a and 24b, the gate material layer 22a and 22b and the gate dielectric layer 20a and 20b from unnecessary electrical connection to the subsequently formed self-aligned contact. The metal layers 24a and 24b, however, often need to be partially etched before the step of filling of the cap layer 38, which inevitably increases the initial height of the gummy gate height and in turn negatively affect the yield rates of the process.

Figure 10:
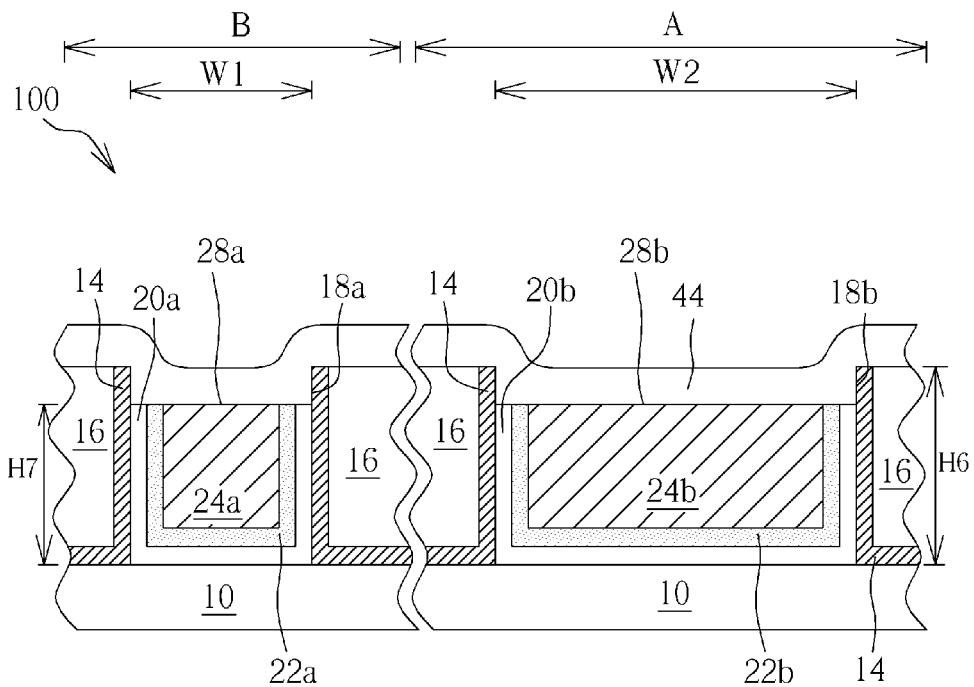

Accordingly, a method without over etching the metal layer is also disclosed according to one embodiment of the present invention. In detail, similar to the step shown in FIG. 3, portions of the first metal layer and the second metal layer are removed in the second etching process. Subsequently, as shown in FIG. 10, a dielectric cap layer 44 is blankly deposited to fill up the first trench 18a and the second trench 18b and cover the dielectric layer 16. Preferably, the dielectric cap layer 44 has a sixth predetermined height HE which is higher than the third predetermined height H3 shown in FIG. 4, while the metal layers 24a and 24b have a seventh predetermined height H7 which is higher than the fourth predetermined height H4 shown in FIG. 4.

Figure 11:
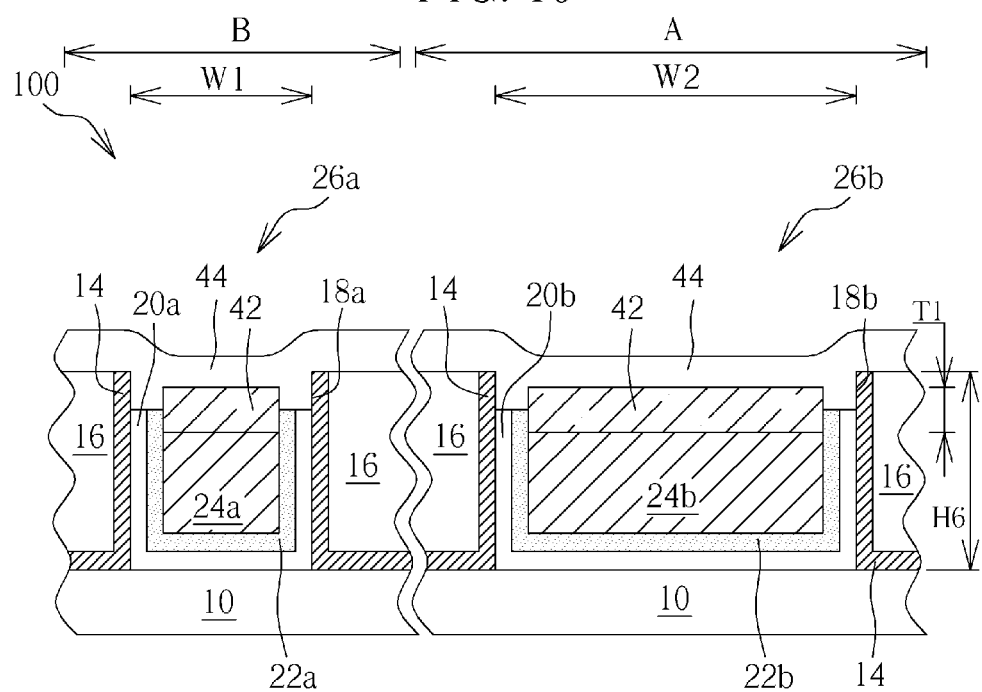

As shown in FIG. 11, an electrostatic field is then applied to the semi-finished semiconductor device 100, which causes a metal compound 42 with a predetermined width T1 to be formed at the interface between the dielectric cap layer 44 and the first metal layer 24a and between the dielectric cap layer 44 and second metal layer 24b. For example, a wafer involving the semi-finished semiconductor device is hold by a platform by electrostatic force, and a metal compound 42 with high resistance may be therefore formed under this electrostatic field. The metal compound 42 with high resistance may be used as a barrier layer to prevent the self-aligned contact from electrically connecting to the underneath metal layers 24a and 24b. In addition, the first metal structure 26a and the second metal structure 26b are respectively disposed in the first region A and the second region B, and the top surface 28a of the first metal layer 24a may be aligned with or slightly lower than the top surface 28b of the second metal layer 24b.

Similarly, because the metal compound 42 is produced from the reaction between the dielectric cap layer 44 and the first metal layer 24a and between the dielectric cap layer 44 and the second metal layer 24b, the metal components of the metal compound 42 must be chosen from at least one of the metal components of the first metal layer 24a or the second metal layer 24b. For example, the metal compound 42 may be composed of tungsten oxide, tungsten nitride, aluminum oxide or aluminum nitride, bur is not limited thereto.

Because the metal compound is used as a barrier layer to prevent the self-aligned contact from contacting with the underneath metal layers 24a and 24b. The planarization may be optionally omitted in the present embodiment. Furthermore, the dielectric layer 16 and the metal layer 24a and 24b in the present embodiment may be consumed to a limited extent, which reduces the height of the initial dummy gate structure and thus increases the yield rate of the processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a metal gate structure, comprising:
   providing a substrate, wherein a dielectric layer, a first trench disposed in the dielectric layer, a first metal layer filling up the first trench, a second trench disposed in the dielectric layer, a second metal layer filling up the second trench are disposed on the substrate, and the width of the first trench is less than the width of the second trench;
   forming a mask layer to completely cover the second trench;
   performing a first etching process to remove portions of the first metal layer when the second trench is covered by the mask layer; and
   performing a second etching process to concurrently remove portions of the first metal layer and portions of the second metal layer after the first etching process.

2. The method according to claim 1, wherein the width of the first trench is at least less than one-third of the width of the second trench.

3. The method according to claim 1, further comprising forming a dielectric film to cover the first trench and the second trench before the step of performing the first etching process.

4. The method according to claim 3, further comprising forming a metal compound at an interface between the dielectric film and the first metal layer before the step of performing the first etching process.

5. The method according to claim 4, wherein the metal compound is a metal oxide or a metal nitride, and metal components of the metal compound is the same as at least one of metal components of the first metal layer.

6. The method according to claim 4, wherein the metal compound is tungsten oxide, tungsten nitride or aluminum nitride.

7. The method according to claim 4, wherein the metal compound is formed by applying an electrostatic field.

8. The method according to claim 4, wherein the metal compound is completely removed during the first etching process.

9. The method according to claim 4, further comprising forming another metal compound at an interface between the dielectric film and the second metal layer during the step of forming the metal compound.

10. The method according to claim 9, wherein another metal compound is completely removed during the second etching process.

11. The method according to claim 1, further comprising removing the mask layer before the second etching process.

12. The method according to claim 1, wherein the height of the first metal layer is less than or equal to the height of the second metal layer when the second etching process is completed.

13. The method according to claim 1, further comprising forming a dielectric cap layer to cover the first metal layer and the second metal layer after the second etching process, wherein the dielectric cap layer is in direct contact with the first metal layer and the second metal layer.

14. The method according to claim 13, further comprising concurrently forming a metal compound at an interface between the dielectric cap layer and the first and second metal layers during the step of forming the dielectric cap layer.

15. The method according to claim 14, wherein the metal compound is metal oxide or metal nitride.

16. The method according to claim 14, wherein the metal compound is tungsten oxide, tungsten nitride or aluminum nitride.

17. The method according to claim 14, wherein the metal compound is formed by applying an electrostatic field.

18. The method according to claim 13, wherein the dielectric cap layer filling up the first trench and the second trench.

19. The method according to claim 1, further comprising forming a first gate dielectric layer and a first gate material layer, wherein the first gate dielectric layer, the first gate material layer and the first metal layer are sequentially disposed in the first trench.

20. The method according to claim 1, further comprising forming a first gate dielectric layer, a second gate dielectric layer, a first gate material layer and a second gate material layer, wherein the first gate dielectric layer, the first gate material layer and the first metal layer are sequentially disposed in the first trench, and the second gate dielectric layer, the second gate material layer and the second metal layer are sequentially disposed in the second trench.

* * * * *